United States Patent [19]
Bakhit et al.

[11] Patent Number: 5,691,245
[45] Date of Patent: Nov. 25, 1997

[54] METHODS OF FORMING TWO-SIDED HDMI INTERCONNECT STRUCTURES

[75] Inventors: Gabriel G. Bakhit, Huntington Beach; Vincent A. Pillai, Irvine; George Averkiou, Upland; Philip A. Trask, Laguna Hills, all of Calif.

[73] Assignee: HE Holdings, Inc., Los Angeles, Calif.

[21] Appl. No.: 738,558

[22] Filed: Oct. 28, 1996

[51] Int. Cl.$^6$ ............................................. H01L 21/60
[52] U.S. Cl. .................... 437/209; 437/214; 437/217
[58] Field of Search .............................. 437/209, 210, 437/211, 212, 213, 214, 215, 216, 217, 218, 219, 220

[56] References Cited

U.S. PATENT DOCUMENTS

| | | | |
|---|---|---|---|
| 4,980,034 | 12/1990 | Voleson et al. | 437/195 |
| 5,039,628 | 8/1991 | Carey | 437/209 |
| 5,192,716 | 3/1993 | Jacobs | 437/209 |
| 5,196,362 | 3/1993 | Suzuki | 437/195 |
| 5,262,351 | 11/1993 | Bureau et al. | 437/215 |
| 5,352,926 | 10/1994 | Andrews | 437/209 |
| 5,400,220 | 3/1995 | Swamy | 437/209 |
| 5,514,613 | 5/1996 | Santadrea | 437/209 |

*Primary Examiner*—Kevin Picardat
*Attorney, Agent, or Firm*—M. E. Lachman; M. W. Sales; W. K. Denson-Low

[57] ABSTRACT

Methods of forming two-sided high density multilayer interconnect (HDMI) structures on a relatively large carrier and subsequently releasing and removing one or more structures to provide useable flexible interconnects or decals. In general, a carrier is provided and a release layer is formed on the carrier. Flexible high density multilayer interconnect structures are fabricated on the release layer. The release layer is processed to release and remove one or more flexible HDMI structures from the carrier. The carrier may be an ultraviolet transparent substrate, such as quartz, for example, and the release layer may be a polyimide layer. The HDMI structures are released by irradiating the release layer through the transparent carrier using ultraviolet radiation from an ultraviolet radiation source. Alternatively, a silicon carrier may be used that has a metal or silicon dioxide release layer formed thereon. The HDMI structures are released from the metal or silicon dioxide release layer by using wet etching procedures.

21 Claims, 7 Drawing Sheets

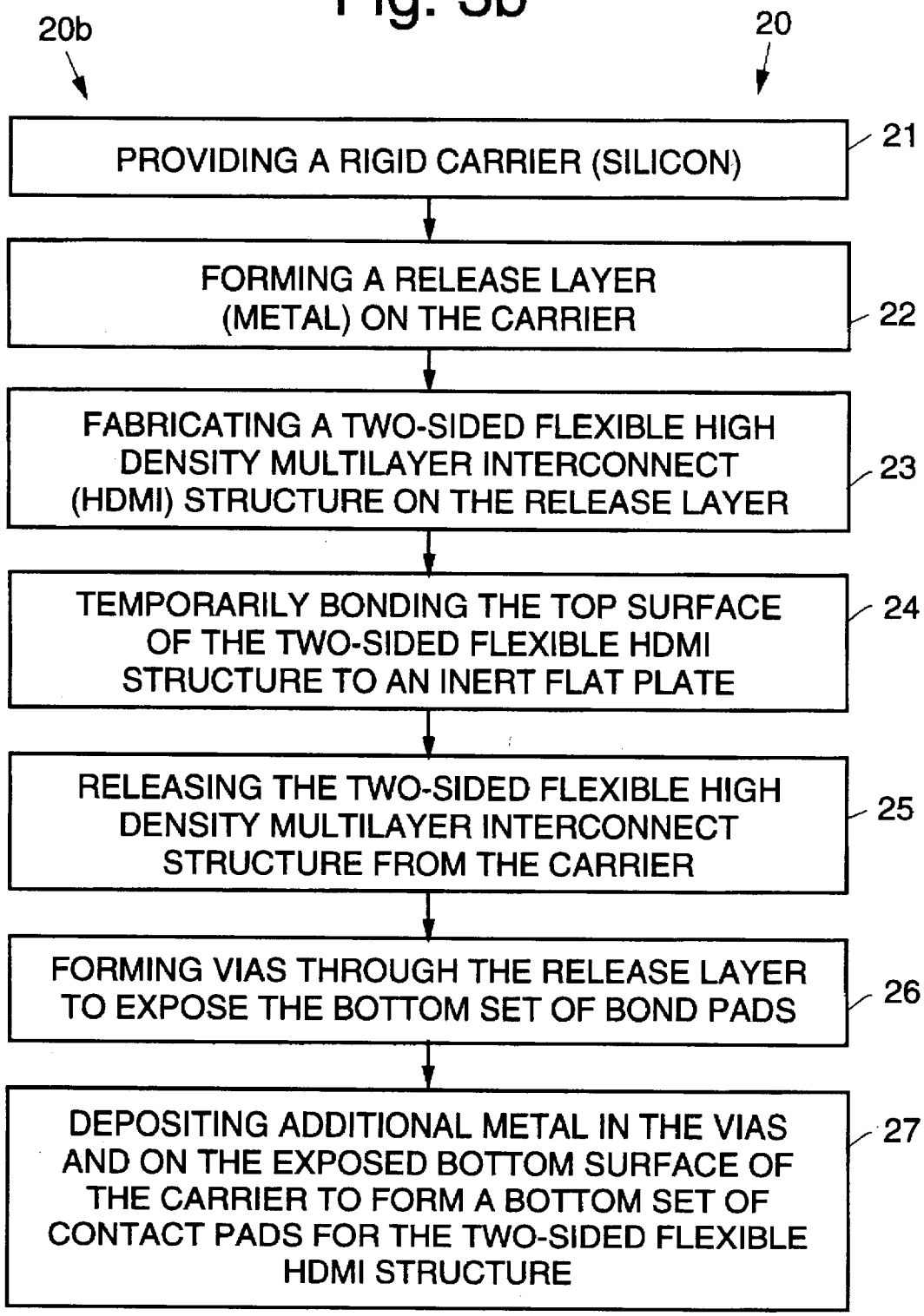

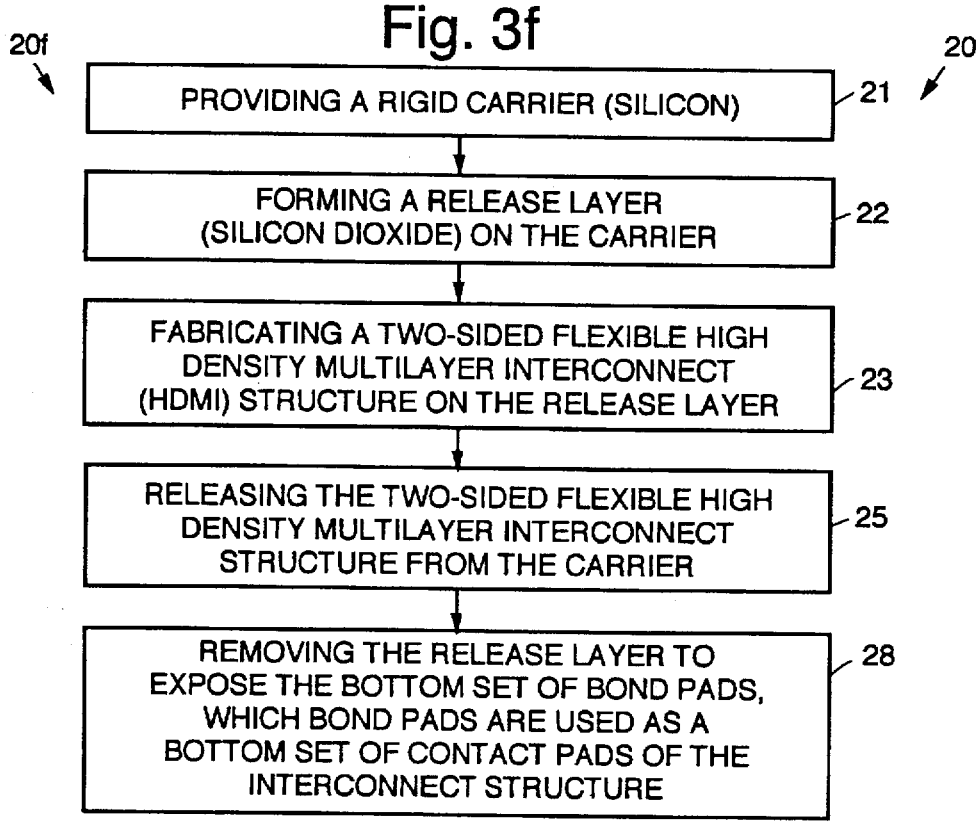
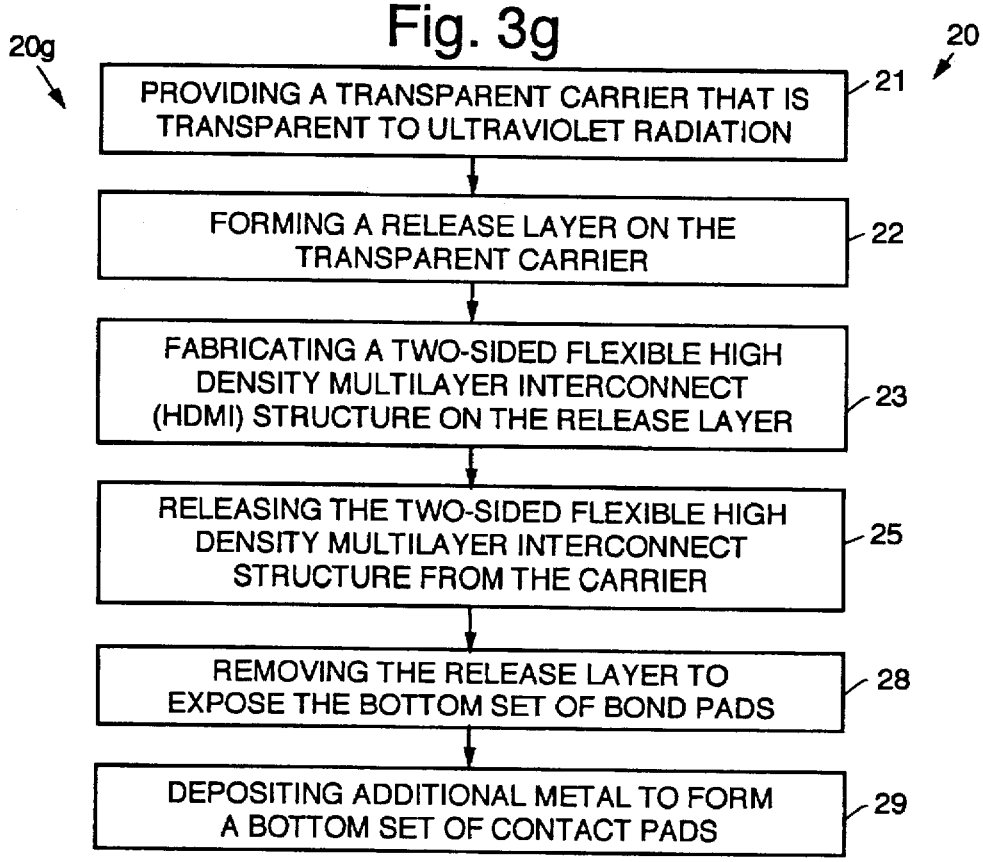

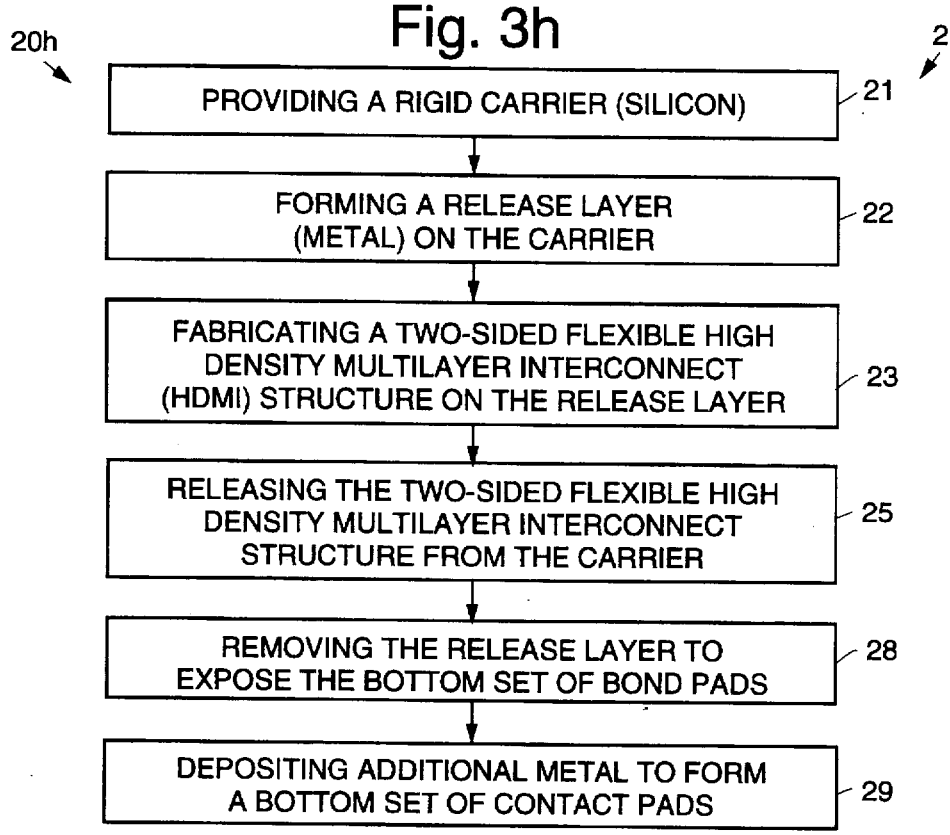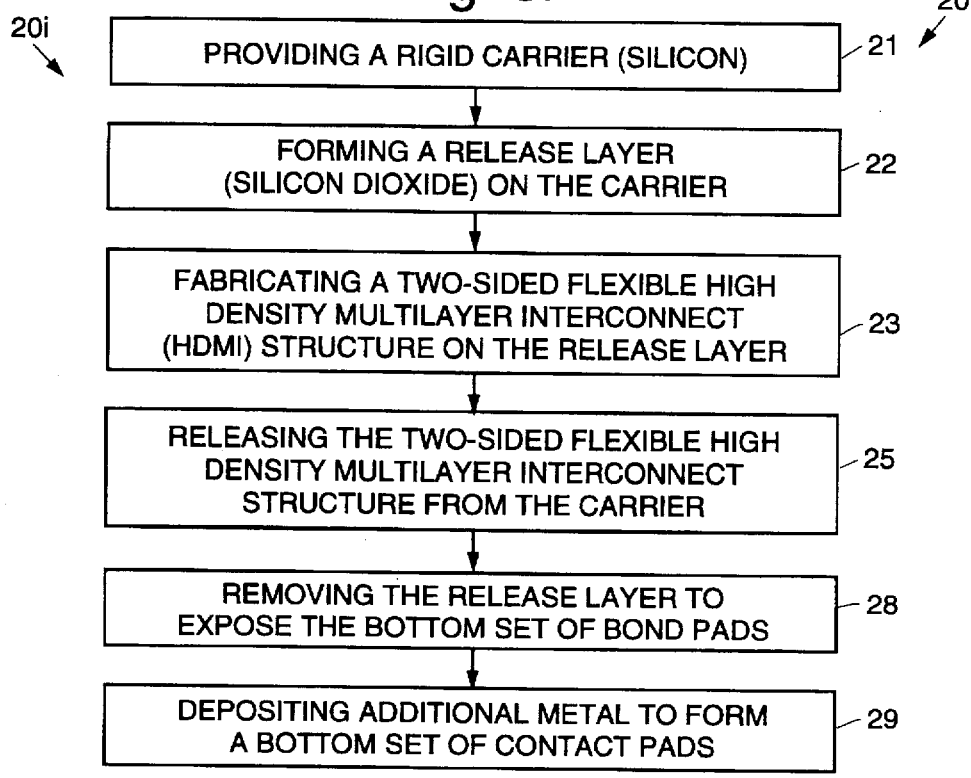

METHODS OF FORMING TWO-SIDED HDMI INTERCONNECT STRUCTURES

BACKGROUND

The present invention relates generally to processing methods of forming high density multichip interconnect (HDMI) structures, and more particularly, to methods of forming two-sided flexible HDMI decals comprising flexible fine line interconnect structures.

Traditional prior art relating to the present invention is provided by a double sided PC board or double sided flexible interconnect circuits. These prior art interconnect structures are manufactured with equipment and processes that limit their line densities. Neither use high performance, high temperature, low coefficient of thermal expansion polyimide dielectric polymer materials.

Traditional flexible interconnect manufacturing techniques are limited in their material selection, thermal capability and line densities. New generation integrated circuits, liquid crystal displays, three dimensional electronic structures and infrared detectors impose ever greater demands for higher line density, improved thermal durability, greater environmental stability and lower cost than can be provided by the conventional interconnect structures. Thus, it would be an improvement to have interconnect structures that provide high two-sided interconnect density at reduced cost and with controlled parasitic effects while providing improved thermal and environmental stability compared to conventional interconnect structures. U.S. patent application Ser. No. 08/629,956, filed Apr. 8, 1996, entitled "HDMI Decal and Fine Line Flexible Interconnect Forming Methods", assigned to the assignee of the present invention discloses methods of forming single-sided high density multilayer interconnect (HDMI) structures. This invention produces single-sided HDMI structures that are useful in producing three-dimensional flexible cables, membrane IC test boards and power devices, and the like that require free line metallized conductors. The present invention improves upon this particular invention.

Accordingly, it is an objective of the present invention to provide for a method of forming two-sided flexible HDMI decals comprising two-sided flexible fine line HDMI interconnect structures.

SUMMARY OF THE INVENTION

To meet the above and other objectives, the present invention provides for methods of forming two-sided high density multilayer interconnect (HDMI) structure on a rigid carrier and subsequently releasing the two-sided interconnect to form a flexible decal with interconnected metallization on both sides of the structure. The present invention improves upon methods disclosed in the above-cited U.S. Patent Application entitled "HDMI Decal and Fine Line Flexible Interconnect Forming Methods", assigned to the assignee of the present invention. The contents of this application are incorporated herein by reference in its entirety.

In the present invention, a carrier, such as quartz, for example, is provided that does not absorb UV or laser radiation, and a release layer, which may comprise a polyimide layer, for example, is formed on the carrier. A two-sided flexible high density multilayer interconnect (HDMI) structure is then fabricated on the release layer. The two-sided flexible HDMI structure is fabricated in a manner that forms a second set of contact pads adjacent to the release layer. After fabrication of the two-sided flexible HDMI structure, the release layer is processed to release (delaminate) and remove it and the two-sided flexible HDMI structure from the carrier.

The release layer of the two-sided flexible HDMI structure is then processed to expose the bottom set of contact pads. This may be achieved in a number of ways. A first way is to temporarily bond the top surface of the decal to an inert flat plate using a temporary adhesive. The decal is then released or delaminated from the carrier to expose bottom surface of the decal, which comprises the polyimide release layer. Vias are formed in the release layer to expose contacts to the bottom set of contact pads. Additional metal is then deposited and patterned on the release layer that contacts the bottom set of contact pads through the vias. This forms the bottom pad layer of the decal to which connections may be made.

A second way to process the two-sided flexible HDMI structure is to release it from the carrier. Then, the release layer is removed to expose the bottom set of contact pads. The exposed bottom set of contact pads may be used as is or may have additional metal layers deposited and patterned for the bottom pad layer of the decal. This procedure may also use the inert flat plate to temporarily bond the top surface of the decal during processing of the bottommost layers thereof.

The two-sided flexible HDMI interconnect structure fabricated in accordance with the present invention may be used in applications that demand high density, low profile, low weight interconnect structures. The present invention produces the highest two-sided interconnect density presently available in a structure that has improved thermal and environmental stability.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 3a–3i are flow diagrams illustrating details of various methods in accordance with the principles of the present invention.

DETAILED DESCRIPTION

Figure 1:
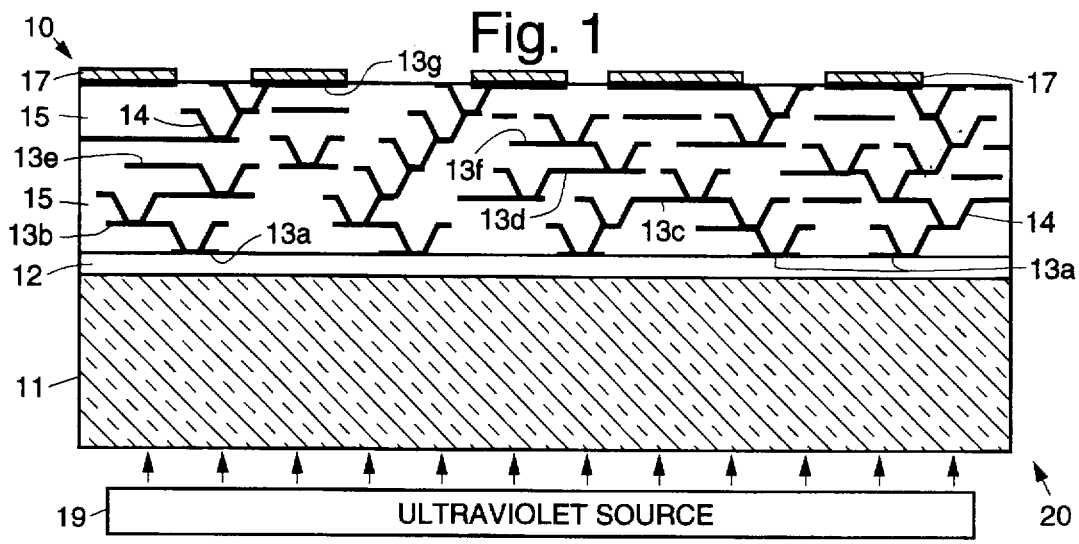
FIG. 1 is a cross sectional side view showing fabrication of a two-sided flexible high density multilayer interconnect structure prior to release from its carrier using methods in accordance with the principles of the present invention.

Referring to the drawing figures, FIG. 1 is a cross sectional side view showing fabrication of a two-sided flexible high density multilayer interconnect (HDMI) structure 10 or HDMI decal 10 fabricated using methods 20 in accordance with the principles of the present invention. The present methods 20 may be implemented using HDMI processes disclosed in U.S. Pat. No. 5,034,091 and U.S. Pat. No. 5,311,404, in addition to methods disclosed in the above-cited U.S. Patent Application entitled "HDMI Decal and Fine Line Flexible Interconnect Forming Methods", for example, all of which are assigned to the assignee of the present invention. The techniques disclosed in these references may be adapted to produce the multilayer interconnect structure 10 on a rigid non-UV or non-laser absorbing carrier 11 as shown in FIG. 1.

The flexible HDMI structure 10 is fabricated on a relatively large carrier 11, typically having dimensions on the order of two feet by two feet. In one embodiment of the present invention, the carrier 11 may comprise an ultraviolet transparent substrate 11 or wafer 11, such as quartz, for example, or may comprise a silicon wafer 11 or a metal carrier, for example, depending upon the release technique that is to be used to remove or release the flexible HDMI structures 10 from the carrier 11.

The carrier 11 has a release layer 12 formed or otherwise deposited thereon. When the ultraviolet transparent substrate 11 is used as the carrier 11, a polyimide layer 12 is deposited as the release layer 12. When the silicon substrate 11 is used as the carrier 11, a metal or silicon dioxide layer 12 is deposited as the release layer 12. The metal release layer 12 may be comprised of titanium or tungsten, or mixtures thereof, for example.

The two-sided flexible HDMI structure 10 is comprised of a plurality of dielectric layers 15 having free line metallization patterns 13 and vias 14 formed therein that terminate at an upper set of contact pads 17 on the top surface of the structure 10. The free line metallization patterns 13 include, but are not limited to, a bottom contact pad layer 13a, pad routing layers 13b, a ground layer 13c, an X-direction signal layer 13d, a Y-direction signal layer 13e, a power layer 13f and an upper contact pad layer 13g. The upper contact pad layer 13g has a plurality of bond pads 17 coupled thereto that are used to connect to electronic components (not shown).

For example, each of the HDMI structures 10 may comprise dielectric layers 15 comprising polyimide having aluminum or copper fine line interconnects 13 and vias 14 formed therethrough that provide signal paths from the upper set of bond pads 17 disposed at the surface of the two-sided HDMI structure 10 to the bottom contact pad layer 13a. The bottom contact pad layer 13a is connected to a lower set of bond pads 13a (FIGS. 2a and 2b) that are connected to electronic components (not shown). The plurality of two-sided HDMI structures 10 are formed on the carrier 11 and release layer 12 using MCM-D (multichip module - dielectric) processing techniques employed by the assignee of the present invention. Processing that may be used to fabricate the two-sided HDMI structures 10 is described in U.S. Pat. No. 5,034,091, entitled "Method of Forming an Electrical Via Structure", and assigned to the assignee of the present invention, which is incorporated herein by reference in its entirety.

Figure 2A:
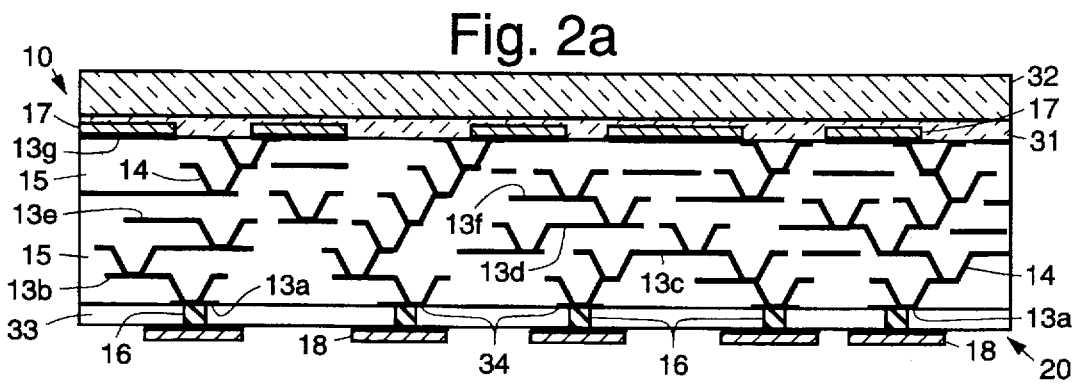
FIGS. 2a, 2b and 2c show fully fabricated two-sided flexible high density multilayer interconnect structures.
Figure 2B:
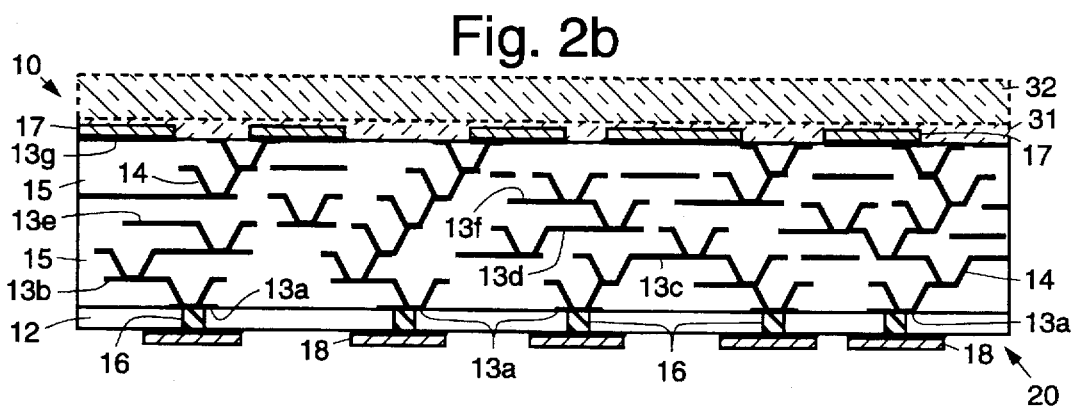

Subsequent to fabrication of the two-sided HDMI structures 10, the release layer 12 is processed to release or remove one or more fabricated two-sided HDMI interconnect structures 10 from the carrier 11. FIGS. 2a and 2b show fully fabricated two sided flexible high density multilayer interconnect structures (without electronic components) after it is released from the carrier 11. Once the plurality of two-sided HDMI structures 10 are formed, in the case where the ultraviolet transparent substrate 11 is used as the carrier 11, a short wavelength ultraviolet radiation source 19, which is programmable and controlled, is used to release individual ones of the two-sided HDMI structures 10. A programmable pick and place machine may be used to physically remove the two-sided HDMI structures 10 once they are released from the carrier 11.

Alternatively, a flood beam ultraviolet radiation source 19 may be used to release many or all of the two-sided HDMI structures 10 from the ultraviolet transparent substrate 11 or carrier 11. The ultraviolet radiation source 19 is caused to radiate ultraviolet radiation through the ultraviolet transparent carrier 11 and onto the release layer 12. For example, an ultraviolet laser may be used to selectively irradiate one of the two-sided HDMI structures 10 to release it from the release layer 12.

The ultraviolet radiation (photons) from the ultraviolet radiation source 19 interacts with the polyimide release layer 12 adjacent to the carrier 11 and ruptures or otherwise breaks the adhesive bond therebetween. This permits the two-sided HDMI structures 10 to be lifted off of the carrier 11 using the programmable pick and place machine or other tool, for example. Multiple two-sided HDMI structures 10 may be released from the carrier 11 using a wide area ultraviolet radiation source 19 in a similar manner.

In cases where the carrier 11 comprises a silicon substrate 11, a titanium or tungsten or mixture thereof metal layer 12, or a silicon dioxide layer 12 is used as the release layer 12. An appropriate wet etching procedure is used to totally release the two-sided HDMI structures 10 from the release layer 12. Wet etching procedures are well known to those skilled in the art that will release the HDMI structures 10.

Referring to FIG. 2a, the release layer 12 of the two-sided flexible HDMI structure 10 must be processed to expose the bond pads at the bottom thereof. This may be achieved by temporarily bonding the top surface of the two-sided flexible HDMI structure 10 to an inert flat plate 32 using a temporary adhesive 31. The two-sided flexible HDMI structure 10 is then released or delaminated from the carrier to expose bottom surface of the structure 10 (the polyimide release layer 12). Vias 16 are formed through the polyimide release layer 12 to expose the bottom set of bond pads 13a. Additional metal is then deposited in the vias 16 and a bottom set of contact pads 18 are formed for the two-sided flexible HDMI structure 10 to which connections may be made.

Referring to FIG. 2b, the second way is to release the two-sided flexible HDMI structure 10 from the carrier 11. Then, the release layer 12 is removed to expose the bottom set of bond pads 13a. The exposed bottom set of bond pads 13a may be used as is to provide a bottom set of contact pads 18 for the flexible HDMI structure 10 to which connections may be made. This procedure may also use the inert flat plate 32 that is temporarily bonded to the top surface of the two-sided flexible HDMI structure 10 during processing of the bottommost layers thereof. Because its use is optional, the inert flat plate 32 and adhesive 31 are shown in dashed lines in FIG. 2b.

Figure 2C:
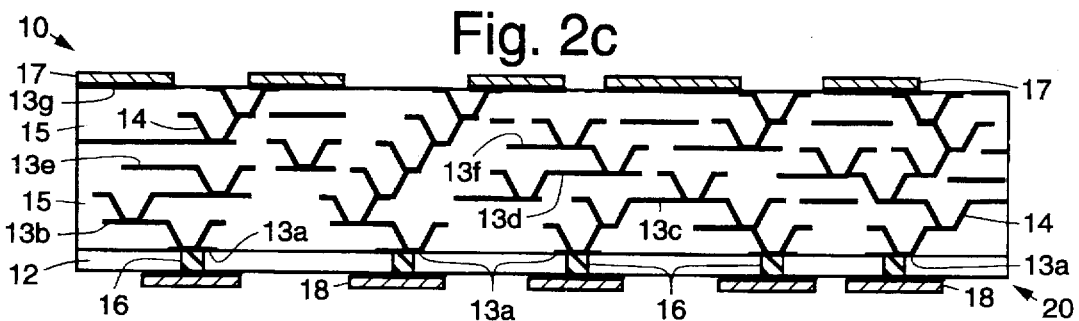

Referring to FIG. 2c, the third way is to release the two-sided flexible HDMI structure 10 from the carrier 11. Then, the release layer 12 is removed to expose the bottom set of bond pads 13a. The exposed bottom set of bond pads 13a are then further processed to provide a bottom set of contact pads 18 for the flexible HDMI structure 10. This may be accomplished by depositing additional metal layers that contact the exposed bottom set of bond pads 13a, thusly forming the bottom set of contact pads 18 of the two-sided flexible HDMI structure 10 to which connections may be made. This procedure may also use the inert flat plate 32 that is temporarily bonded to the top surface of the two-sided flexible HDMI structure 10 during processing of the bottommost layers thereof. Because its use is optional, the inert flat plate 32 and adhesive 31 are shown in dashed lines in FIG. 2c.

The two-sided flexible HDMI structure 10 may be fully populated prior to exposing the bottom side thereof to a short wavelength high energy laser beam, or a short UV broad spectrum high intensity flash lamp that vaporizes the polyimide release layer 12 and exposes the set of bond pads adjacent the bottom side of the structure 10.

For the purposes of completeness, FIGS. 3a–3i show flow diagrams illustrating methods 20 in accordance with the present invention for forming two-sided flexible HDMI structures 10 on a carrier 11 and subsequently releasing them either individually or in total from the carrier 11. The present methods 20 are as follows.

Figure 3A:
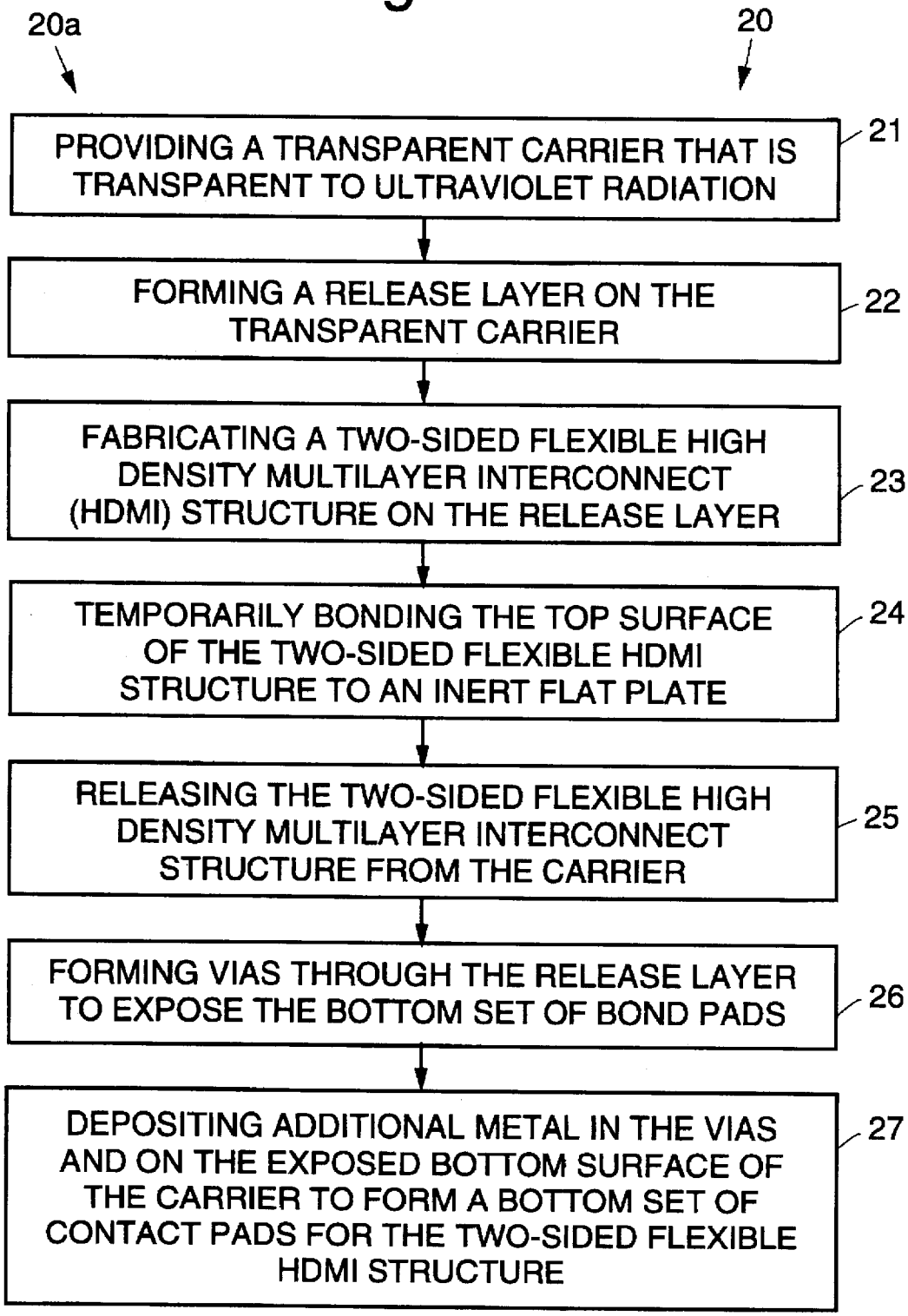

Referring to FIG. 3a, a first method 20a comprises the steps of providing 21 a transparent carrier 11 that is transparent to ultraviolet radiation, and forming 22 a release layer 12 on the transparent carrier 11. Then two-sided flexible high density multilayer interconnect structures 10 are then fabricated 23 on the release layer 12. The top surface of the two-sided flexible HDMI structure 10 is then temporarily bonded 24 to an inert flat plate 32 using a temporary adhesive 31. The two-sided flexible HDMI structure 10 is then released 25 or delaminated 25 from the carrier 12 to expose the release layer 12. A laser is then used to form 26 vias 16 through the release layer 12 to expose the bottom set of bond pads 13a. A bottom set of contact pads 18 is formed for the two-sided flexible HDMI structure 10 by depositing 27 additional metal in the vias 16 and on the exposed bottom surface of the carrier 12.

Referring to FIG. 3b, a second method 20b comprises the steps of providing 21 a carrier 11, such as a silicon carrier 21a, forming 22 a release layer 12, such as a metal (titanium or tungsten or mixture thereof) release layer 12, on the carrier 11, fabricating 23 two-sided flexible high density multilayer interconnect structures 10 on the metal release layer 12. The top surface of the two-sided flexible HDMI structure 10 is then temporarily bonded 24 to an inert flat plate 32 using a temporary adhesive 31. The two-sided flexible HDMI structure 10 is then released 25 or delaminated 25 from the carrier to expose the release layer 12. A laser is then used to form 26 vias 16 through the release layer 12 to expose the bottom set of bond pads 13a. A bottom set of contact pads 18 is formed 27 for the two-sided flexible HDMI structure 10 by depositing 27 additional metal in the vias 16 and on the exposed bottom surface of the carrier 12.

Figure 3C:
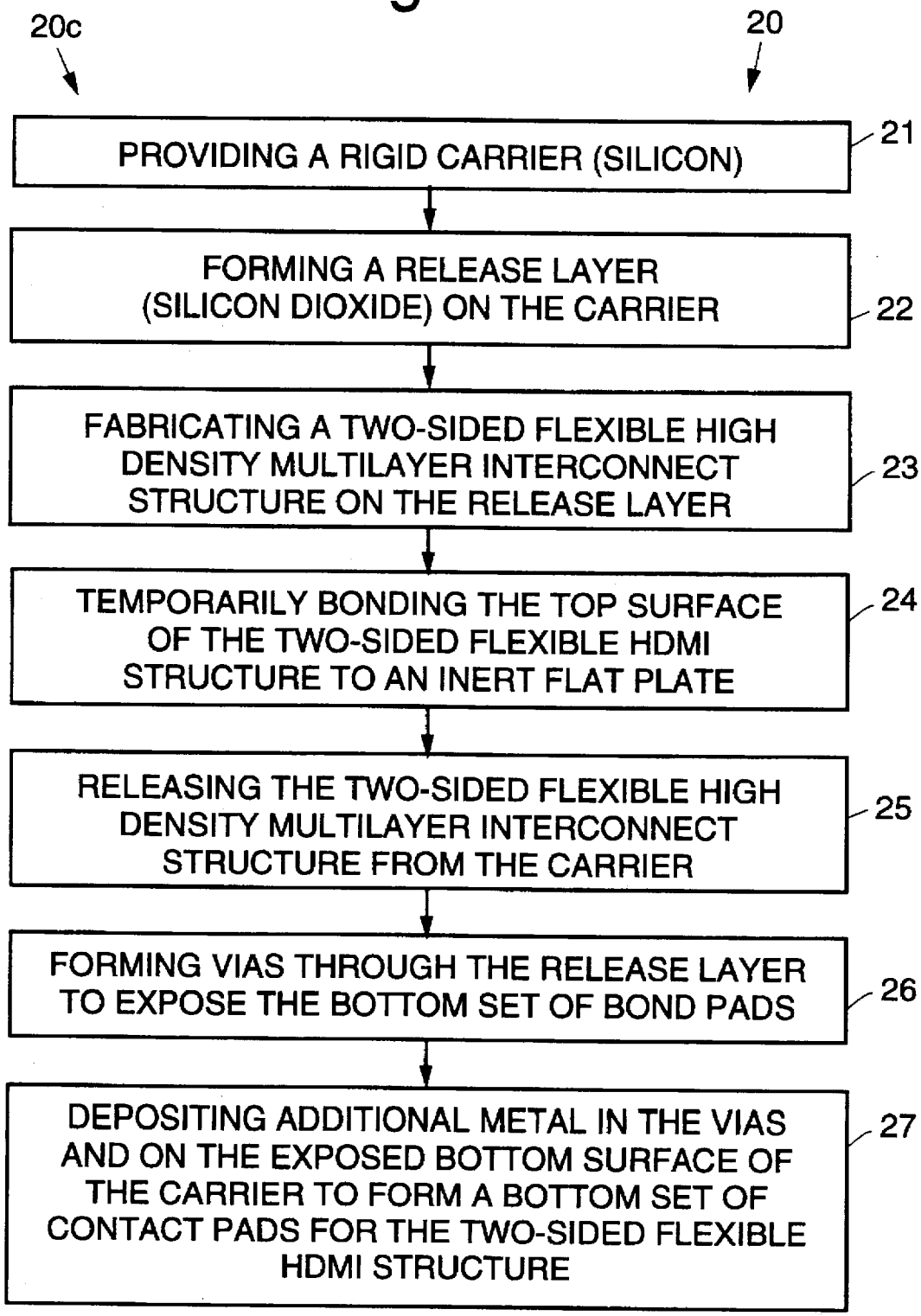

Referring to FIG. 3c, a third method 20c comprises the steps of providing 21 a carrier 11, such as a silicon carrier 11, forming 22 a release layer 12, such as a silicon dioxide release layer 12, on the rigid carrier 11, fabricating 23 two-sided flexible high density multilayer interconnect (HDMI) structures 10 on the release layer 12. The top surface of the two-sided flexible HDMI structure 10 is then temporarily bonded 24 to an inert flat plate 32 using a temporary adhesive 31. The two-sided flexible HDMI structure 10 is then released 25 or delaminated 25 from the carrier to expose the release layer 12. A laser is then used to form 26 vias 16 through the release layer 12 to expose the bottom set of bond pads 13a. A bottom set of contact pads 18 is formed 27 for the two-sided flexible HDMI structure 10 by depositing 27 additional metal in the vias 16 and on the exposed bottom surface of the carrier 12.

Figure 3D:
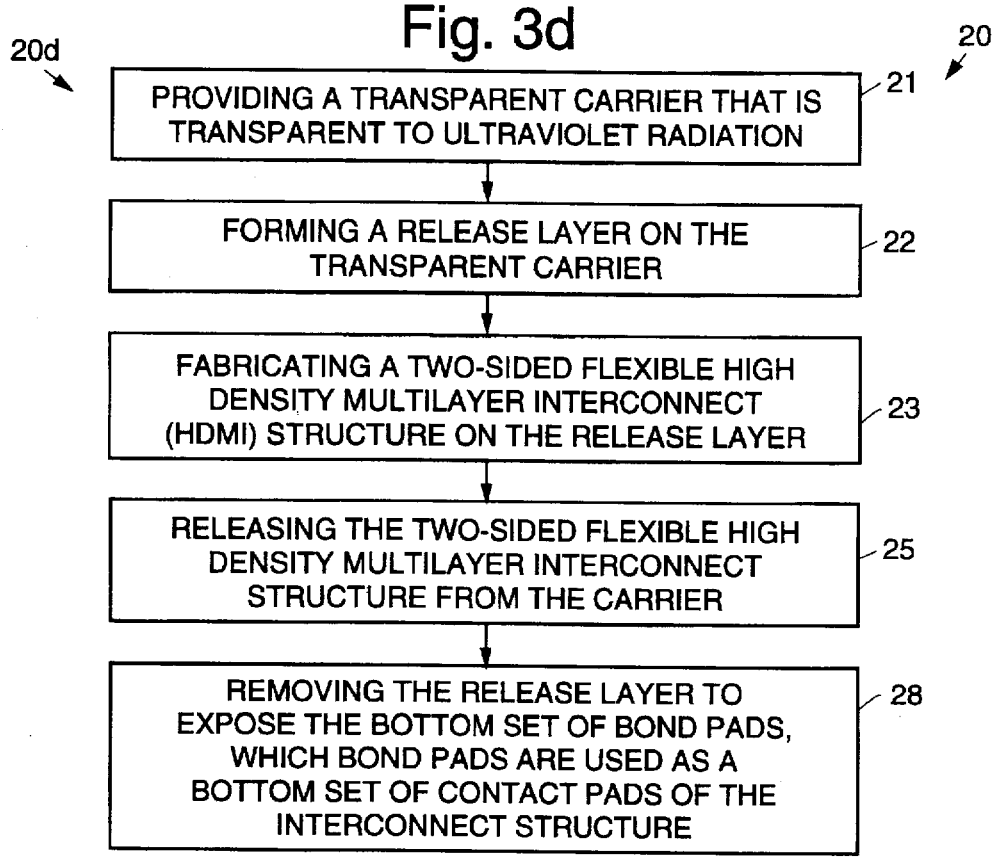

Referring to FIG. 3d, a fourth method 20d comprises the steps of providing 21 a transparent carrier 11 that is transparent to ultraviolet radiation, and forming 22 a release layer 12 on the transparent carrier 11. Then two-sided flexible high density multilayer interconnect structures 10 are fabricated 23 on the release layer 12, and processed to release 25 the flexible HDMI structures 10 from the rigid carrier 11. The two-sided flexible high density multilayer interconnect structures 10 may be released 25 by irradiating the release layer 12 through the transparent carrier 11 using an ultraviolet radiation source 19. Then, the release layer 12 is removed 28 to expose the bottom set of bond pads 13a. The exposed bottom set of bond pads 13a are used as the bottom set of contact pads 18 of the flexible HDMI structure 10.

Figure 3E:
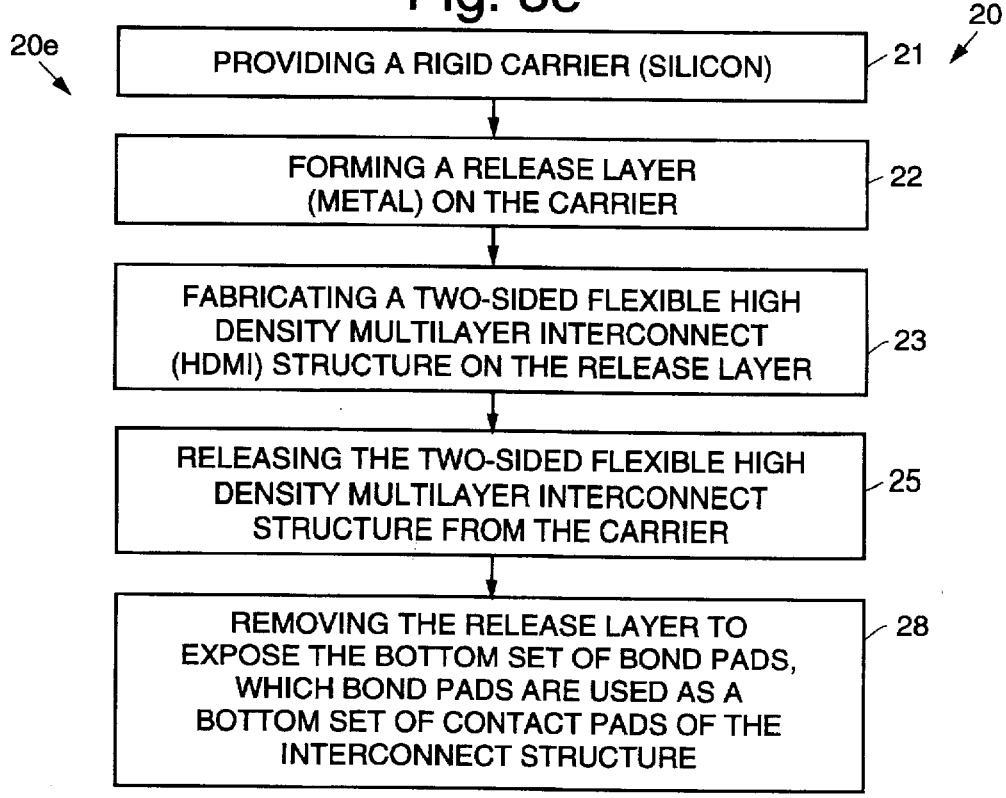

Referring to FIG. 3e, a fifth method 20e comprises the steps of providing 21 a carrier 11, such as a silicon carrier 11, forming 22 a release layer 12, such as a metal (titanium or tungsten or mixture thereof) release layer 12, on the carrier 11, fabricating 23 two-sided flexible high density multilayer interconnect structures 10 on the metal release layer 12, and processing the metal release layer 12 to release 25 the two-sided flexible HDMI structures 10 from the carrier 11, such as by using a wet etching procedure. Then, the release layer 12 is removed 28 to expose the bottom set of bond pads 13a. The exposed bottom set of bond pads 13a are used as the bottom set of contact pads 18 of the flexible HDMI structure 10.

Referring to FIG. 3f, a sixth method 20f comprises the steps of providing 21 a carrier 11, such as a silicon carrier 11, forming 22 a release layer 12, such as a silicon dioxide release layer 12, on the rigid carrier 11, fabricating 23 two-sided flexible high density multilayer interconnect (HDMI) structures 10 on the release layer 12, and processing the release layer 12 to release 25 the two-sided flexible HDMI structures 10 from the rigid carrier 11, such as by using a wet etching procedure. Then, the release layer 12 is removed 28 to expose the bottom set of bond pads 13a. The exposed bottom set of bond pads 13a are used as the bottom set of contact pads 18 of the flexible HDMI structure 10.

Referring to FIG. 3g, a seventh method 20g comprises the steps of providing 21 a transparent carrier 11 that is transparent to ultraviolet radiation, and forming 22 a release layer 12 on the transparent carrier 11. Then two-sided flexible high density multilayer interconnect structures 10 are fabricated 23 on the release layer 12, and processed to release 25 the flexible HDMI structures 10 from the rigid carrier 11. The two-sided flexible high density multilayer interconnect structures 10 may be released 25 by irradiating the release layer 12 through the transparent carrier 11 using an ultraviolet radiation source 19. Then, the release layer 12 is removed 28 to expose the bottom set of bond pads 13a. The exposed bottom set of bond pads 13a are then further processed 29 to provide a bottom set of contact pads 18 for the flexible HDMI structure 10. This may be accomplished by depositing 29 additional metal layers that contact the exposed bottom set of bond pads 13a, thusly forming the bottom set of contact pads 18 of the two-sided flexible HDMI structure 10 to which connections may be made.

Referring to FIG. 3h an eighth method 20h comprises the steps of providing 21 a carrier 11, such as a silicon carrier 11, forming 22 a release layer 12, such as a metal (titanium or tungsten or mixture thereof) release layer 12, on the carrier 11, fabricating 23 two-sided flexible high density multilayer interconnect structures 10 on the metal release layer 12, and processing the metal release layer 12 to release 25 the two-sided flexible HDMI structures 10 from the carrier 11, such as by using a wet etching procedure. Then, the release layer 12 is removed 28 to expose the bottom set of bond pads 13a. The exposed bottom set of bond pads 13a are then further processed 29 to provide a bottom set of contact pads 18 for the flexible HDMI structure 10. This may be accomplished by depositing 29 additional metal layers that contact the exposed bottom set of bond pads 13a, thusly forming the bottom set of contact pads 18 of the two-sided flexible HDMI structure 10 to which connections may be made.

Referring to FIG. 3i, a ninth method 20i comprises the steps of providing 21 a carrier 11, such as a silicon carrier 11, forming 22 a release layer 12, such as a silicon dioxide release layer 12, on the rigid carrier 11, fabricating 23 two-sided flexible high density multilayer interconnect (HDMI) structures 10 on the release layer 12, and processing the release layer 12 to release 25 the two-sided flexible HDMI structures 10 from the rigid carrier 11, such as by using a wet etching procedure. Then, the release layer 12 is removed 28 to expose the bottom set of bond pads 13a. The exposed bottom set of bond pads 13a are then further processed 29 to provide a bottom set of contact pads 18 for the flexible HDMI structure 10. This may be accomplished by depositing 29 additional metal layers that contact the exposed bottom set of bond pads 13a, thusly forming the bottom set of contact pads 18 of the two-sided flexible HDMI structure 10 to which connections may be made.

Thus, methods of forming two-sided flexible HDMI decals comprising flexible fine line interconnect structures has been disclosed. It is to be understood that the described embodiments are merely illustrative of some of the many specific embodiments which represent applications of the principles of the present invention. Clearly, numerous and varied other arrangements may be readily devised by those skilled in the art without departing from the scope of the invention.

What is claimed is:

1. A method of forming a two-sided high density multichip interconnect structure, said method comprising the steps of:

providing a carrier;

forming a release layer on the carrier;

fabricating a two-sided flexible high density multilayer interconnect structure on the release layer that has a bottom set of bond pads;

temporarily bonding the top surface of the two-sided flexible HDMI structure to an inert flat plate;

releasing the two-sided flexible high density multilayer interconnect structure from the carrier;

forming vias through the release layer to expose the bottom set of bond pads; and depositing additional metal in the vias and on the exposed bottom surface of the carrier to form a bottom set of contact pads for the two-sided flexible HDMI structure that contact the bottom set of bond pads.

2. The method of claim 1 wherein the carrier comprises a transparent carrier that is transparent to ultraviolet radiation.

3. The method of claim 2 wherein the transparent carrier comprises quartz.

4. The method of claim 2 wherein the release layer comprises polyimide.

5. The method of claim 2 wherein the step of releasing the two-sided interconnect structure comprises the step of irradiating the release layer through the transparent carrier using an ultraviolet radiation source.

6. The method of claim 2 wherein the release layer comprises a metal release layer.

7. The method of claim 6 wherein the metal release layer comprises titanium.

8. The method of claim 6 wherein the metal release layer comprises tungsten.

9. The method of claim 6 wherein the step of processing the metal release layer to release the flexible high density multilayer interconnect structure from the carrier comprises wet etching the metal release layer.

10. The method of claim 1 wherein the two-sided flexible high density multilayer interconnect structure comprises dielectric layers having metal free line interconnects and vias formed therethrough that provide signal paths between bond pads at surfaces of the high density multilayer interconnect structure.

11. A method of forming a two-sided high density multichip interconnect structure, said method comprising the steps of:

providing a carrier;

forming a release layer on the carrier;

fabricating a two-sided flexible high density multilayer interconnect structure on the release layer that has a bottom set of bond pads;

releasing the two-sided flexible high density multilayer interconnect structure from the carrier;

removing the release layer to expose the bottom set of bond pads;

depositing an additional polyimide layer over the bottom set of bond pads;

forming vias through the additional polyimide layer to expose the bottom set of bond pads; and forming bottom contact pads that contact the bottom set of bond pads of the two-sided flexible HDMI structure.

12. The method of claim 11 further comprising the step of:

temporarily bonding the top surface of the two-sided flexible HDMI structure to an inert flat plate prior to releasing the two-sided flexible high density multilayer interconnect structure from the carrier.

13. The method of claim 11 wherein the carrier comprises a transparent carrier that is transparent to ultraviolet radiation.

14. The method of claim 12 wherein the transparent carrier comprises quartz.

15. The method of claim 12 wherein the release layer comprises polyimide.

16. The method of claim 12 wherein the step of releasing the two-sided interconnect structure comprises the step of irradiating the release layer through the transparent carrier using an ultraviolet radiation source.

17. The method of claim 11 wherein the release layer comprises a metal release layer.

18. The method of claim 17 wherein the metal release layer comprises titanium.

19. The method of claim 17 wherein the metal release layer comprises tungsten.

20. The method of claim 17 wherein the step of processing the metal release layer to release the flexible high density multilayer interconnect structure from the carrier comprises wet etching the metal release layer.

21. The method of claim 11 wherein the two-sided flexible high density multilayer interconnect structure comprises dielectric layers having metal free line interconnects and vias formed therethrough that provide signal paths between bond pads at surfaces of the high density multilayer interconnect structure.

* * * * *